United States Patent
Parise

[19]

[11] Patent Number: 6,114,834
[45] Date of Patent: Sep. 5, 2000

[54] REMOTE CHARGING SYSTEM FOR A VEHICLE

[76] Inventor: Ronald J. Parise, 101 Wendover Rd., Suffield, Conn. 06078

[21] Appl. No.: 09/436,291

[22] Filed: Nov. 8, 1999

Related U.S. Application Data

[63] Continuation of application No. 08/934,270, Sep. 19, 1997, Pat. No. 5,982,139.
[60] Provisional application No. 60/046,027, May 9, 1997.

[51] Int. Cl.[7] .............................. H02J 7/00; B02K 21/00
[52] U.S. Cl. ......................... 320/109; 361/235; 180/313; 701/22; 322/2 R
[58] Field of Search .................................. 320/109, 106, 320/107, 108; 361/235; 180/313; 701/22; 322/2 R; 244/1 R

[56] References Cited

U.S. PATENT DOCUMENTS

| | | | |
|---|---|---|---|
| 3,114,517 | 12/1963 | Brown | 244/172 |
| 3,174,705 | 3/1965 | Schiff et al. | 244/172 |
| 3,781,647 | 12/1973 | Glaser | 322/2 R |
| 3,971,454 | 7/1976 | Waterbury | 180/65.8 |
| 3,989,994 | 11/1976 | Brown | 322/2 R |
| 4,078,747 | 3/1978 | Minovich | 322/2 R |
| 4,187,506 | 2/1980 | Dickenson | 342/362 |
| 4,667,203 | 5/1987 | Counselman, III | 342/357 |
| 5,223,781 | 6/1993 | Criswell et al. | 322/2 R |
| 5,503,350 | 4/1996 | Foote | 244/1 R |
| 5,563,491 | 10/1996 | Tseng | 320/109 |
| 5,573,090 | 11/1996 | Rose | 191/10 |
| 5,636,122 | 6/1997 | Shah et al. | 701/207 |
| 5,644,207 | 7/1997 | Lew et al. | 320/101 |
| 5,654,621 | 8/1997 | Seelig | 320/108 |
| 5,697,466 | 12/1997 | Motoro et al. | 108/65.2 |
| 5,710,502 | 1/1998 | Poumey | 320/108 |
| 5,982,139 | 11/1999 | Parise | 320/109 |

Primary Examiner—Peter S. Wong
Assistant Examiner—Gregory J. Toatley, Jr.
Attorney, Agent, or Firm—Alix, Yale & Ristas, LLP

[57] ABSTRACT

This invention is a remote charging system for use with an electrical storage device mounted in an electric or electric/hybrid vehicle. The system includes a power transmission unit capable of transmitting electrical energy to the electrical storage device via a wireless energy beam. The vehicle includes an antenna capable of receiving the wireless energy beam and transferring the electrical energy to the storage device. The vehicle further includes a translocator for transmitting a coded signal to the power transmission unit corresponding to the location of the vehicle and thereby activating the power transmission unit. The power transmission unit receives and locks onto the coded signal and thereby tracks the vehicle during the charging operation. The translocator signal is transmitted until the electrical storage unit reaches a predetermined level of charge.

17 Claims, 9 Drawing Sheets

REMOTE CHARGING SYSTEM FOR A VEHICLE

CROSS-REFERENCE TO RELATED APPLICATIONS

This application is a continuation of application Ser. No. 08/934,270 filed Sep. 19, 1997 now Pat. No. 5,982,139 which claims the benefit of U.S. Provisional Application Ser. No. 60/046,027 filed May 9, 1997.

BACKGROUND OF THE INVENTION

1. Field of the Invention

The present invention relates in general to a charging system for a battery. In particular the present invention relates a remote charging system for electric and hybrid electric vehicles.

2. Prior Art

There have been numerous attempts and initiatives established for next generation land based vehicles. Some programs have set goals for vehicle mileage of 80 miles/gal and greatly reduced vehicle emissions based on today's standards. Federal and local governments have placed limits on emissions ans well as standards for fuel consumption. Even with regenerative braking energy, a hybrid electric/internal combustion vehicle will be pressed to meet these goals. A wireless method of transmitting electrical energy to vehicles would help to overcome present obstacles.

One of the major causes of smog today is the use of city buses for public transportation. Diesel and gasoline driven buses spew out tons of pollutants daily. Utilization of buses powered by electricity would eliminate this source of pollution from our cities. To date, the most reliable electric source has been overhead tethered line or on-ground tracks. But these greatly reduce the convenience of route changes and are at the mercy of small traffic pattern changes which can cause traffic tie-ups. The ideal electric bus would have a completely mobile energy source, such as a battery pack. But the limited range of a battery powered vehicle has diminished its use to only specific cases.

In large cities a single battery pack, consisting of several standard 12- or 24-volt batteries, provides for driving an all-electric bus one or two route cycles before the vehicle must be pulled out of service for either an expensive battery pack replacement to allow the battery unit time to be recharged while the vehicle is put back on the road immediately with a fresh battery pack; or taken completely out of commission while the battery unit is being charged on the vehicle. Recharging the battery pack can be a four-or five-hour process. Therefore an all-electric, completely mobile city bus service is cumbersome to run and maintain, difficult to meet schedules and expensive to operate.

Originally wireless power transmission system was proposed to augment the existing system of electrical conductors that are used to move large quantities of electrical power over long distances. In the mid-1960s a system was proposed to convert large quantities of solar energy into an energy beam that could be transmitted from outer space to the surface of the earth through satellite transmissions. Once on earth the energy beam would be converted back to a usable voltage form that would be pumped into the existing electrical energy distribution grid. Several transmission frequencies of the energy spectrum have been considered to minimize the energy loss from the beam as it travels through the atmosphere, such as radio frequency (RF), laser, and optical frequency (OF). For the RF energy beam, atmospheric attenuation is a minimum up to 4 Ghz, even during a heavy rainstorm. Other windows of transmission exist at 35 Ghz and 94 Ghz. Systems designed to operate at these relatively high frequencies have the added advantage of operating at smaller apertures wherein the transmitting antenna and the receiving antenna can be smaller. Such systems have been considered for transmission distances of kilometers in conjunction with satellites in low earth orbit or geosynchronous orbit, transmitting to the surface of the earth. Transmitting from space to the surface of the earth also eliminates laser beams from traveling long distances in the earth's atmosphere.

A wireless remote system capable of transmitting at distances of 200 to 500 meters is needed. With these relatively short distances, while taking into account additional power requirements for attenuation in the earth's atmosphere, many more RF bands become available, as well as the viability of transmitting energy via laser beam. Laser energy beam technology also has the advantage of having relatively small transmitting and receiving antennae. What is needed is a remote charger system for an electric vehicle which replaces the current internal combustion engine, reduces emissions problems, and which enables the electric vehicles to have full mobility. There is also a need for a vehicle remote charge network which can be installed with minimum impact on existing streets and is expandable from public transportation vehicles to private all-electric vehicles.

SUMMARY OF THE INVENTION

The above-discussed and other drawbacks and deficiencies of the prior art are overcome or alleviated by the Remote Vehicle Charging System of the present invention.

The Remote Vehicle Charging System of the present invention utilizes a wireless power transmission network to charge on-board electrical energy storage systems. The network of the present invention will be established on existing power line and telephone poles or new stand-alone poles for use in conjunction with the existing poles. Radio frequency (RF) wavelengths such as a microwave or a millimeterwave system or optical frequencies (OF), a laser based system, are examples of wireless energy transmission systems of the present invention. The remote vehicle charging system of the present invention includes logic devices for controlling power transmission unit's and coded signals from translocators for control and billing of the charging operation. A translocator mounted to vehicle sends a coded signal to a pole mounted power transmission unit. The power transmission unit transmits electrical energy to an antenna mounted on the vehicle via a wireless energy beam.

The electric vehicle receives pulsed remote charging for intervals of a few seconds up to several minutes as it comes within range of each power transmission unit located along its route. The antenna is mounted in the vehicle with transmitters and the power transmission unit's having beam aiming devices are strategically positioned along the route the vehicle travels.

The above discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figure 1:
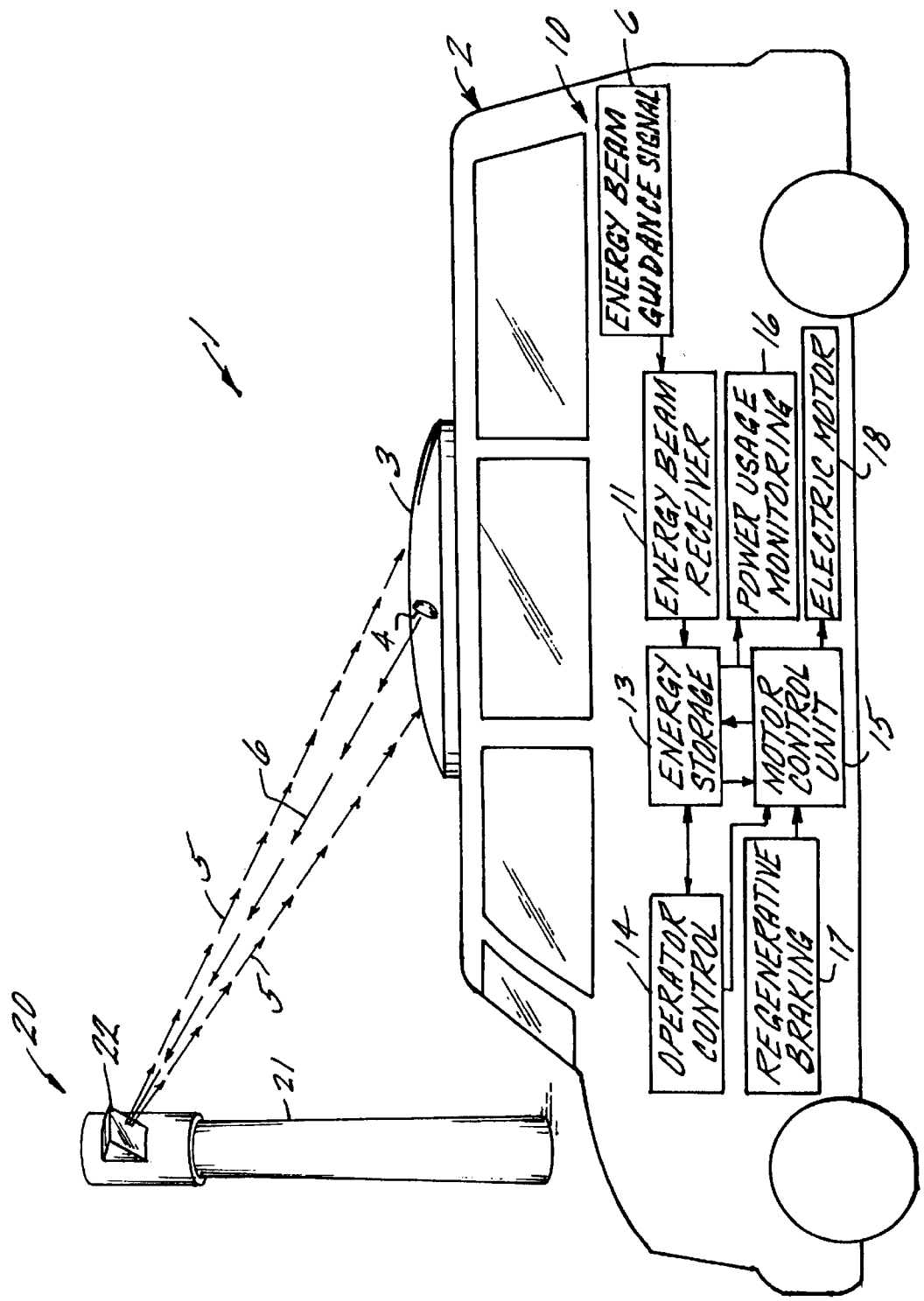
FIG. 1 is a schematic illustration of an electric vehicle incorporating the remote charging system of the present invention.

Referring to FIG. 1 there is shown an electric vehicle and system employing the remote charging system of the present invention. Remote charging system 1 includes electric vehicle 2 having receiving antenna 3 and translocator 4, power transmission unit 20 mounted to pole 21 having receiver/transmitter 22. Vehicle 2 includes power control system 10 having energy beam receiver 11, energy beam guidance signal 12, energy storage unit 13, operator control 14, motor control unit 15, power usage monitoring device 16, regenerative braking device 17, and electric motor 18. The power transmission unit is a stationary unit electrically connected to the existing electric power grid (not shown). The power transmission unit includes circuitry to condition and send wireless power transmission beam 5. As vehicle 2 travels the roadway translocator signal 6 is transmitted from the translocator. The power transmission unit includes a tracking unit (not shown) capable of detecting the presence of the translocator signal and tracks the location of the vehicle. The power transmission unit receives the translocator signal and locks onto the progress of the vehicle. The power transmission unit then transmits wireless power transmission beam 5 to antenna 6 while following the path of the vehicle until translocator signal 6 is lost or interrupted.

Referring to the power control system schematic in FIG. 1 shows the operation of the charging system of the present invention. Energy beam guidance signal 6 is sent out by the translocator to the power transmission unit. The power transmission unit in turn transmits energy beam 5 to antenna 3 where it is conditioned by energy beam receiver 11 into a usable power form. The power is then transmitted by receiver to energy storage device 13. It is contemplated that energy storage device could advantageously be in the form of a flywheel, a battery, a capacitor or other rechargeable type of energy storage device. In an embodiment of the present invention energy storage device 13 is a lead-acid battery. Electrical energy from the energy storage device is used to operate the various electrical components on-board the vehicle. Motor control unit 15 coordinates the flow of electrical energy from the energy storage device to electric motor 18 which is used to drive the vehicle. The motor control unit also controls the flow of energy from regenerative braking system 17 to the energy storage device. The regenerative braking system converts the energy generated from slowing and stopping the vehicle into electrical energy and transmits the energy to the motor control unit. The motor control unit monitors the amount of energy consumed by the vehicle as well as the amount of energy transferred to the vehicle. The motor control unit also controls the distribution of energy between the regenerative braking system, the motor, and the energy storage unit. The motor control unit further provides energy consumption data to power usage monitoring unit 16. Operator control 14 is the operator interface and utilized by the driver of the vehicle in similar fashion to that of prior art vehicles.

The power transmission unit receives the translocator signal and transmits the energy beam to the vehicle. The energy beam is received by the vehicle's power receiving antenna and the energy is transmitted to the energy storage device as required. If the energy storage device is completely recharged, the translocator signal is shut down, and there is no transfer of energy.

Figure 2:
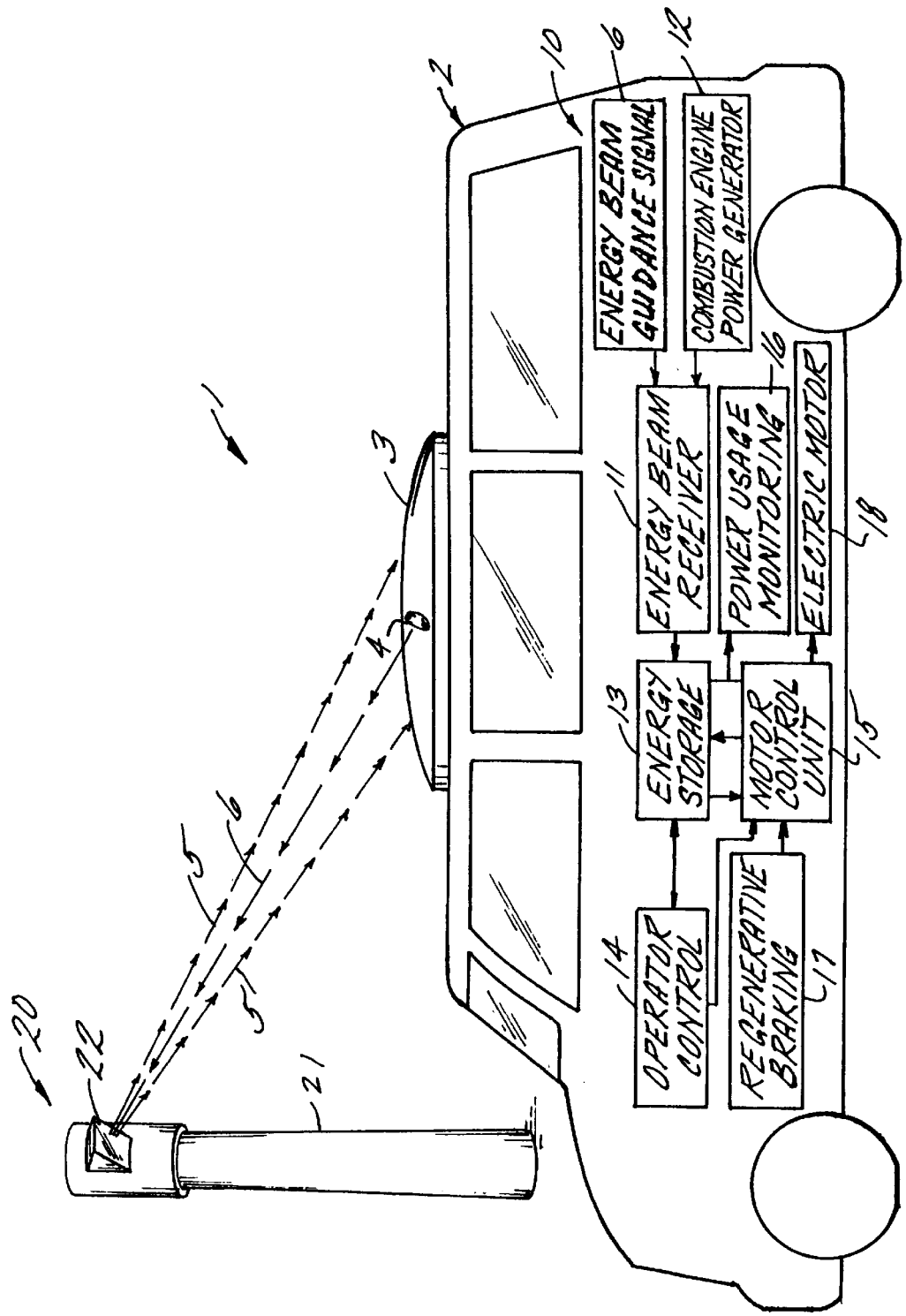
FIG. 2 is a schematic illustration of a hybrid electric vehicle incorporating the remote charging system of the present invention.

Referring to FIG. 2 there is shown the present invention incorporated in hybrid vehicle 7. Hybrid vehicle 7 includes internal combustion engine 12. The hybrid vehicle functions similar to that described herein above. The inclusion of the internal combustion generator allows for the vehicle to be operated for longer periods before being charged remotely as in cases where a power transmission unit is not encountered. When the motor control unit senses that the level of energy in the energy storage unit is below a predetermined level the internal combustion generator is operated using fossil fuels to generate electrical energy which is in turn supplied to the motor control unit for storage or consumption.

Figure 3:
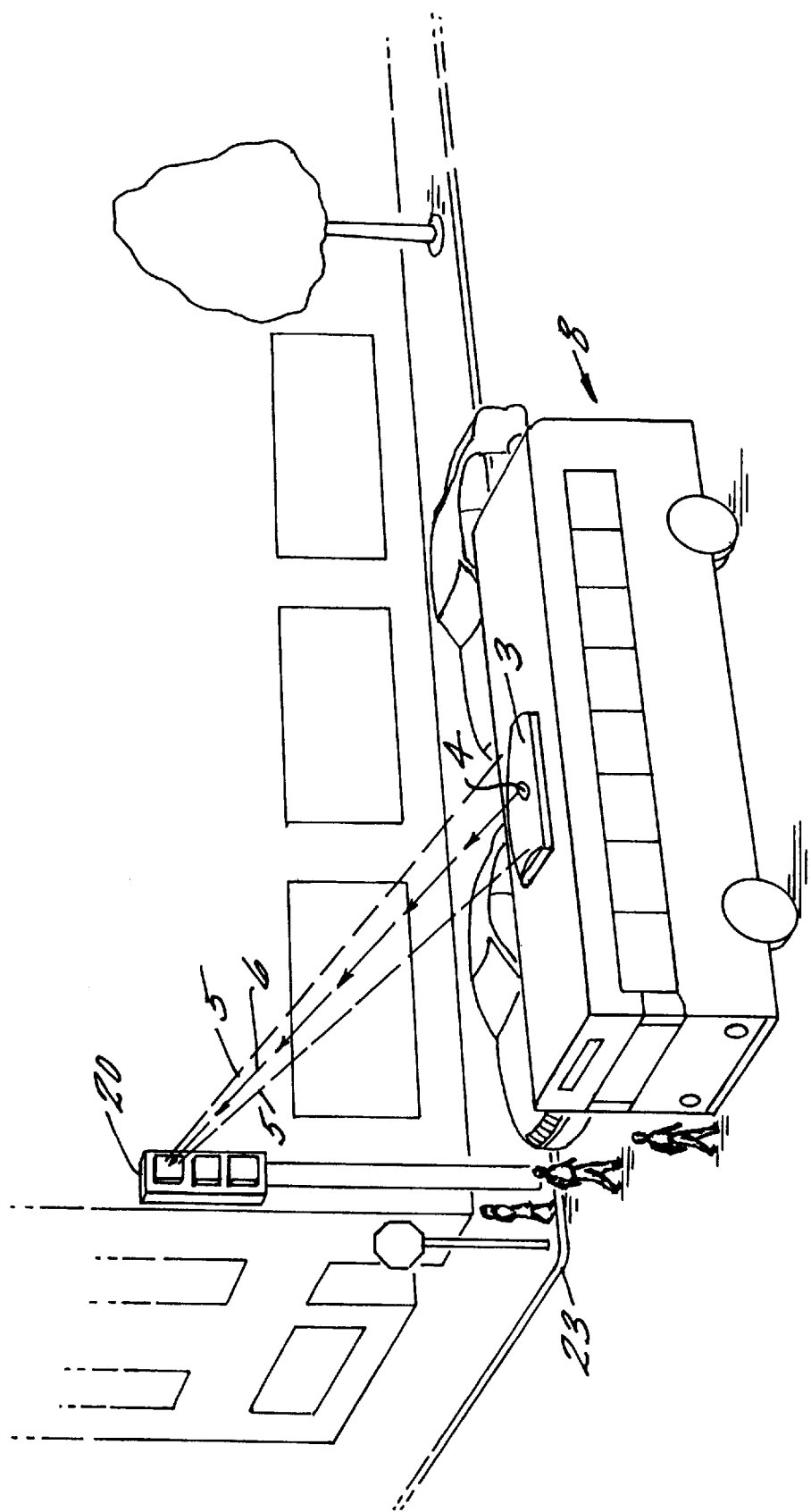
FIG. 3 is a graphical illustration of an embodiment of the present invention incorporated in an urban setting.
Figure 4:
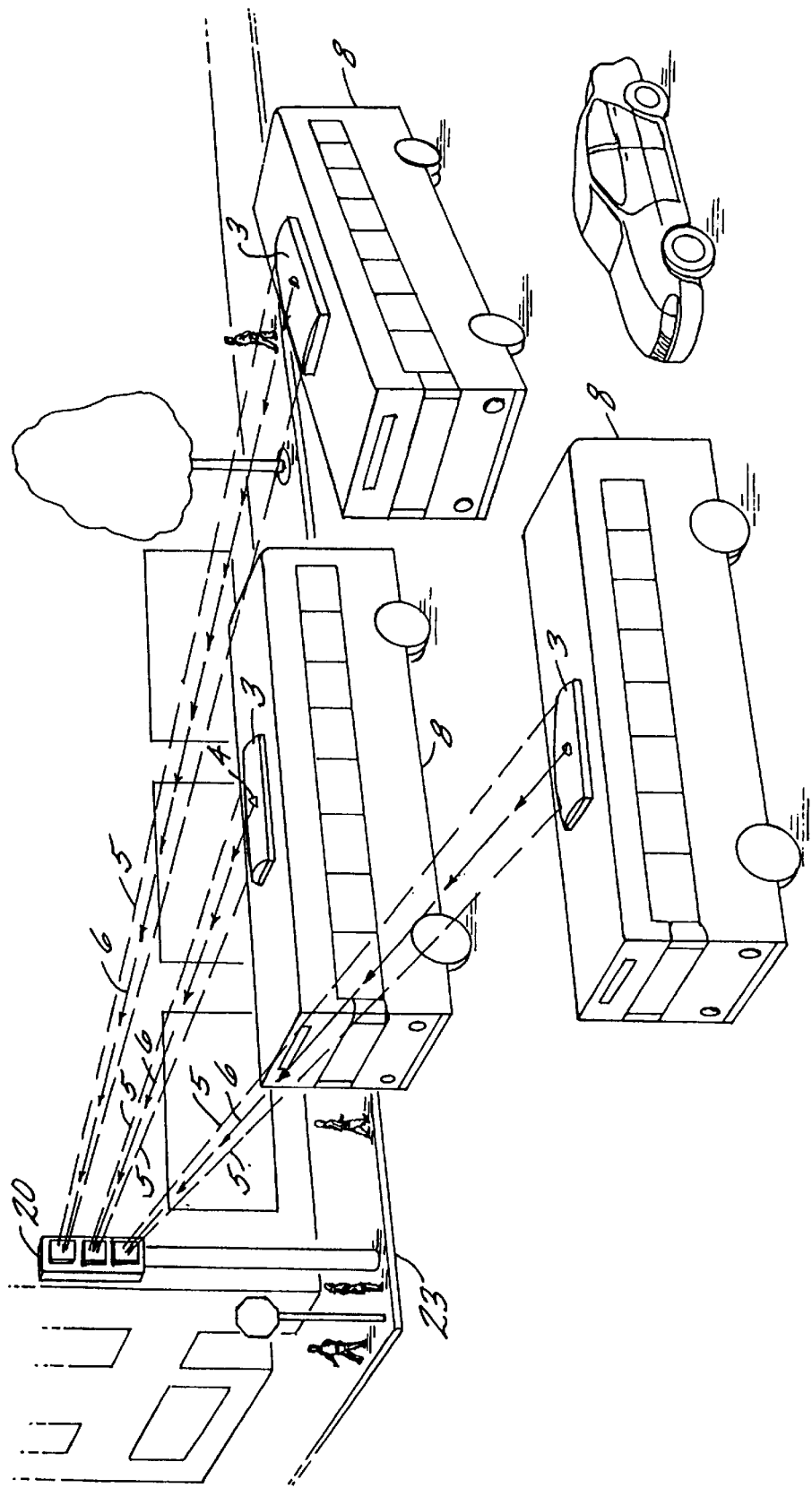
FIG. 4 is a graphical illustration of another embodiment of the present invention incorporated in an urban setting.

Referring to FIG. 3 there is shown a public transportation system utilizing an embodiment of the present invention. Bus 8 is shown stopped at corner 23 of a typical city street which includes power transmission unit 20. The bus includes the power control unit described herein above. While stopped for discharging and loading passengers translocator 4 transmits a signal intercepted receiver transmitter 22 which transmits wireless power transmission beam 5 to antenna 3. In this typical operation there is no interruption of service to the bus or passengers. The energy storage unit of the bus is recharged at each such street corner including a power transmission unit. The benefit over many prior art systems is also illustrate in FIG. 3. Because cars are parked at the curb there would be no possibility for a curb mounted charging system, such as induction systems, to charge the storage unit of the bus. With the embodiment described the storage unit of the bus is charged by the power transmission unit at any location within range of the wireless power transmission seam. FIG. 4 shows three city buses located near street corner 23. In this embodiment all three buses are having their energy storage systems recharged while they are in the intersection. The power transmission unit 20 includes multiple receiver/transmitters 22, three in this embodiment to simultaneously recharge the storage units of multiple vehicles.

An embodiment of the present invention includes a power transmission unit having the capability of transmitting multiple power transmission beams from a single receiver/transmitter. In another embodiment the translocator signal from a vehicle would be coded to identify the vehicle. The identification of the signal allows the power transmission unit to track a vehicle and trade signals among receiver/ transmitters to minimize interferences and crossing of energy beams. In addition, coded translocator signals allow user identification to electrical power companies for billing purposes.

In the setting shown in FIG. 3 any one of the three buses could change position with any of the other buses and there would be no difference as far as energy beams are concerned. The first bus that arrives in range of the power transmitting unit has its translocator signal locked onto by one of the power energy beam transmitters. The second bus that arrives in range of the power transmitting unit has its translocator signal locked onto by the next available power beam, and so on. A priority system can be set up so that the beams are activated in a particular order, and the order can be rotated so that all transmitting units obtain the same amount of usage time. With the individual translocator signals coded if the beams cross one another's path, the transmitting units will not get confused and follow the wrong vehicle. It is anticipated that transmitter circuitry would trade translocator beams and hence power beams to eliminate the destructive interference that may occur between power beams if they cross for too long a time.

Figure 5:
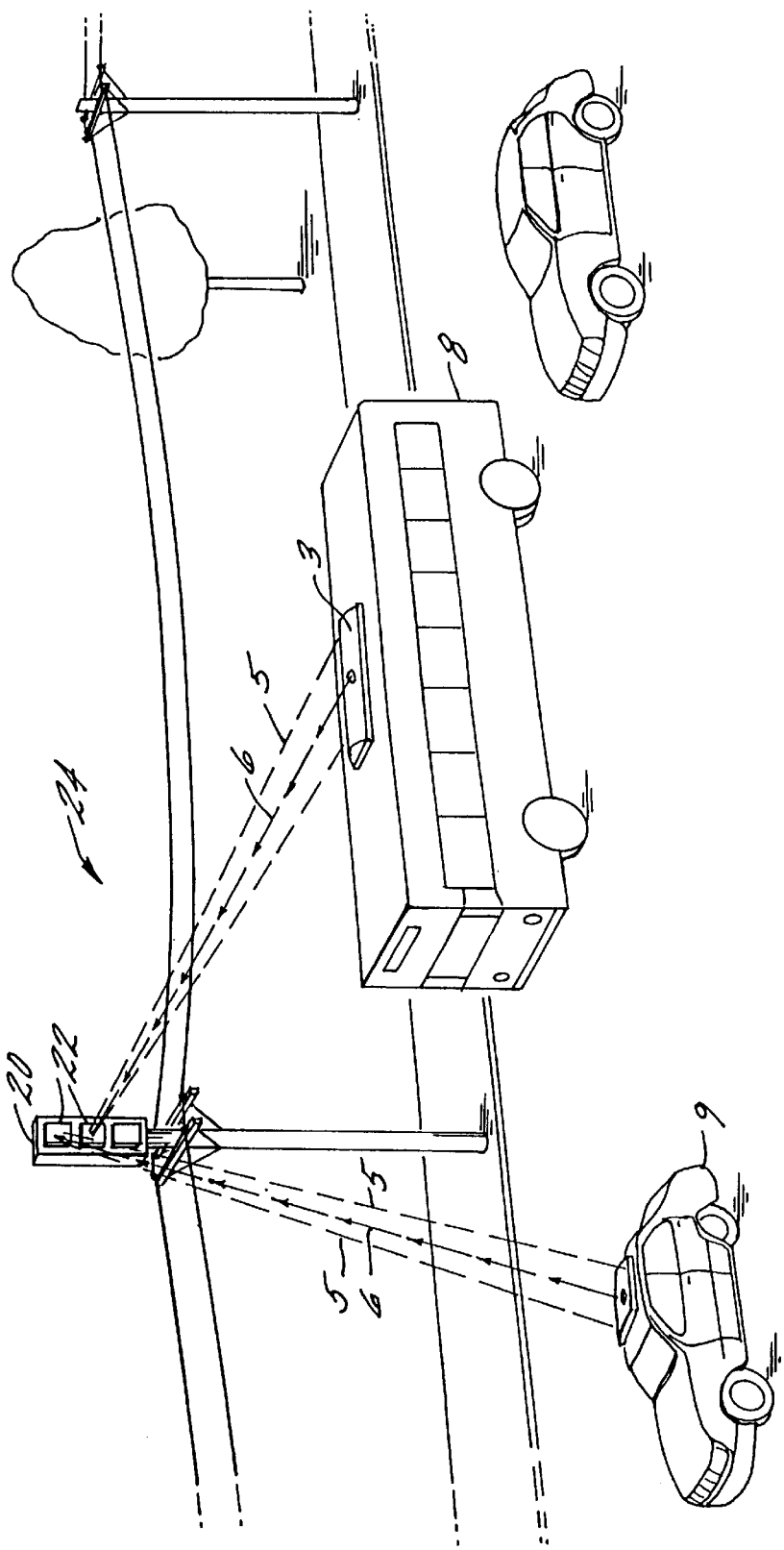
FIG. 5 is a graphical illustration of an embodiment of the present invention incorporated in an rural setting.

Referring to FIG. 5 there is shown a remote charging system of the present invention incorporated into a typical rural street setting 24. Electric car 9 includes the power control unit of the present invention described herein above. As the car and bus pass power transmission unit 20 translocator signals 6 are received by receiver/transmitters 22 which in turn transmit wireless power transmission beams 5 to the two vehicles. The beam transmissions continue until the vehicles are either fully charged, at which time the translocator signal will be interrupted, or the vehicle travels beyond the range of the power transmission unit. Pole 21 is illustrated as wooden however it is contemplated that the poles could advantageously be comprised of metal or fiber reinforced composite materials.

Figure 6:
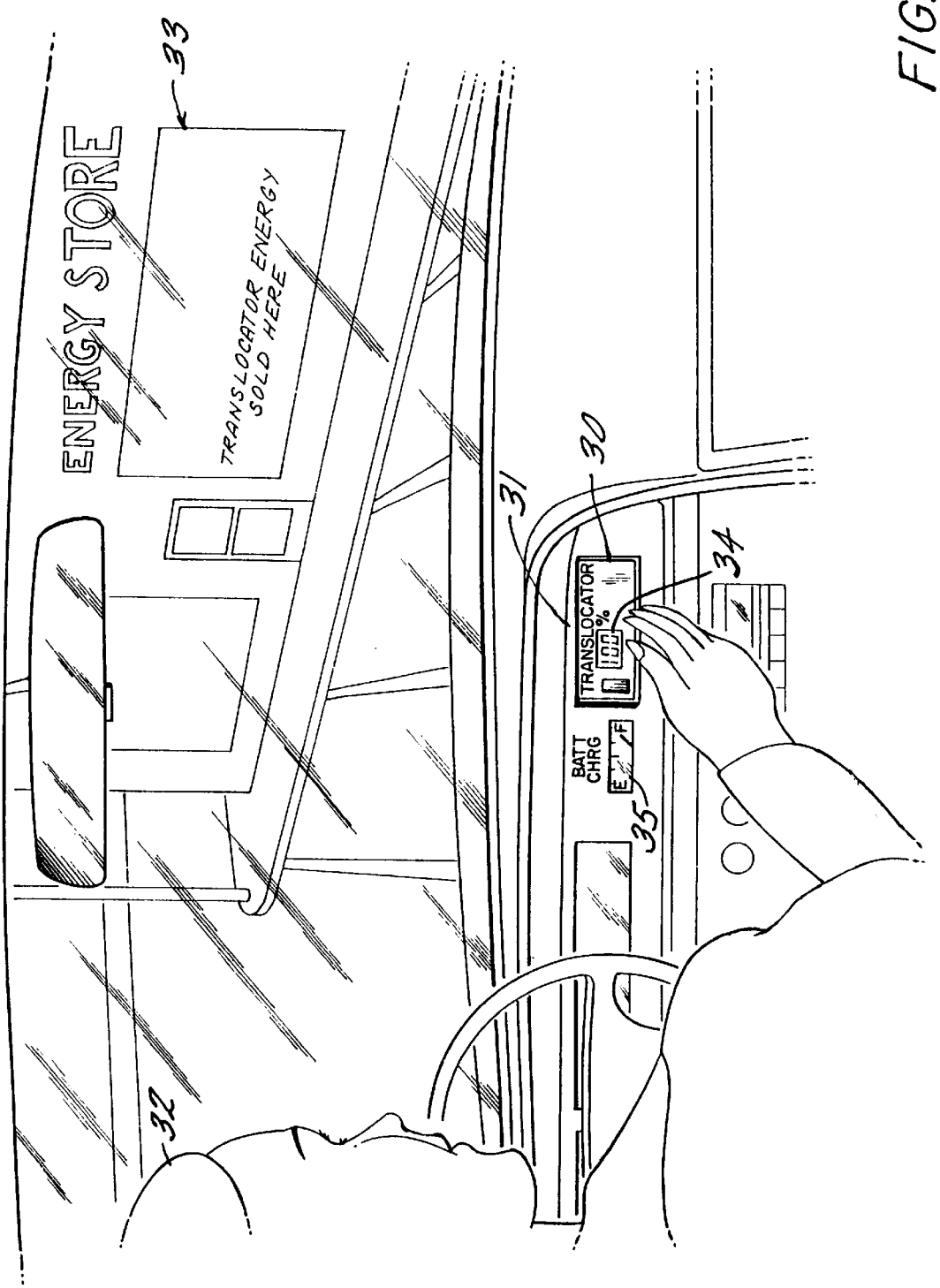
FIG. 6 is a graphical illustration of an embodiment of a translocator in a vehicle.

Shown in FIG. 6 is an embodiment of translocator energy unit 30 of the present invention as incorporated in dashboard 31 of a private electric vehicle. It is contemplated that the translocator energy units would be electrically replenishable meters operably connected to the translocator of the vehicle which could be removed and installed by vehicle operator 32. It is contemplated that the vehicle operator would remove the translocator energy unit form the dashboard and deliver it to consumer outlet 33. Vehicle operator would remit payment to the consumer outlet corresponding to a certain amount of wireless energy. The consumer outlet would electrically replenish the translocator to a level corresponding to that amount of energy. With the charged translocator unit reinstalled in the vehicle the translocator will transmit a signal and the vehicle will receive the wireless power transmission beam from power transmission unit's until the corresponding amount of energy in the translocator energy unit is exhausted. The translocator energy unit also includes metered readout 34 which corresponds to the level of energy units remaining in the unit before replenishment is exhausted. Also shown in FIG. 6 is energy storage meter 35 which is a graphical readout corresponding to the level of charge remaining in the energy storage unit. By way of example in an embodiment the amount of energy. available to the electric vehicle would allow it to travel 400–500 miles, the equivalent of about one tank of gasoline in typical internal combustion driven passenger vehicle. An operator would be able to replenish the translocator energy unit with 400–500 miles worth of power transmission unit energy transmission.

Figure 7:
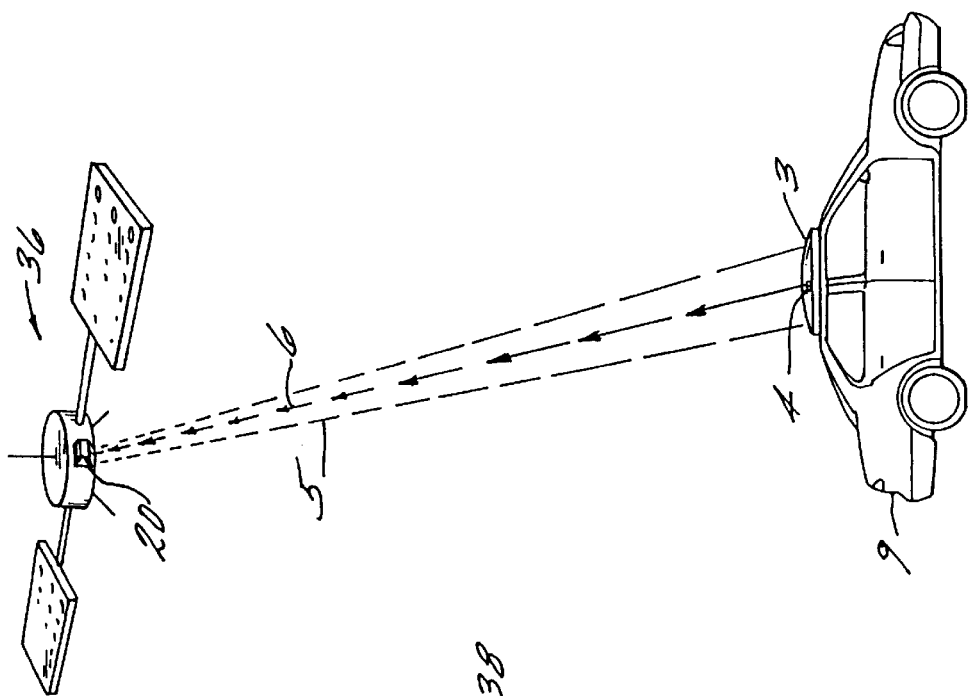
FIG. 7 is a graphical illustration of a satellite incorporating a power transmission unit according to the present invention.

Referring to FIG. 7 there is shown a power transmission unit of the present invention located on satellite 36 for remote vehicle travel in rural parts of the country. The all-electric vehicle 9 would have the mobility of any internal combustion engine vehicle, and the range (distance between translocator recharge) can be extended well beyond any gasoline fuel tank.

Figure 7A:
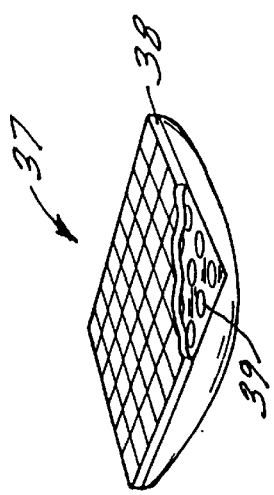
FIG. 7A is a perspective view in partial section of a rectenna and solar antenna according to the present invention.

Shown in FIG. 7A is combination receiving antenna 37. The combination receiving antenna includes rectenna 38 and solar panel 39. The rectenna is positioned in the upper surface of the combination receiving antenna and is comprised of a rectifying antenna to capture and absorb wireless power energy transmission in the form of RF energy beams. By contrast the solar panel is mounted in the lower portion and adapted to capture and absorb wireless power energy transmission in the form of a laser energy beams. The rectenna is essentially transparent to the laser beam; thereby allowing the electric vehicle to receive either type of energy beam. Because of the narrow bandwidth of laser energy the combination antenna may be advantageously suited to city use.

Figure 9:
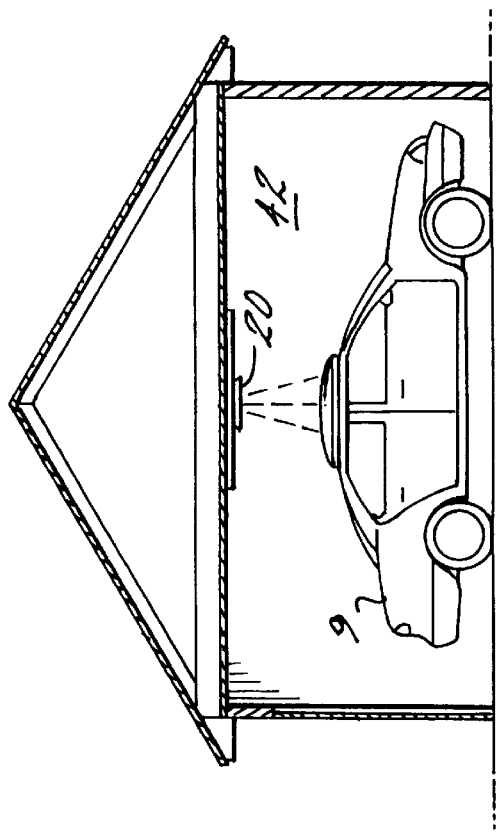
FIG. 9 is a side view of a power transmission unit installed in a garage.
Figure 8:
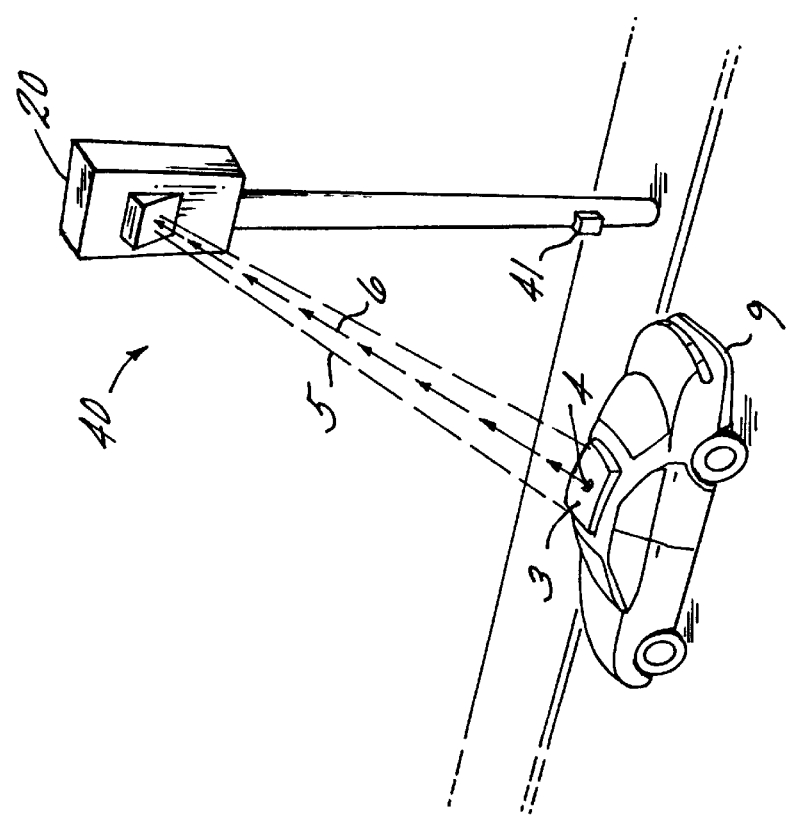
FIG. 8 is a perspective illustration of a power transmission unit incorporating a point of purchase device.
Figure 10:
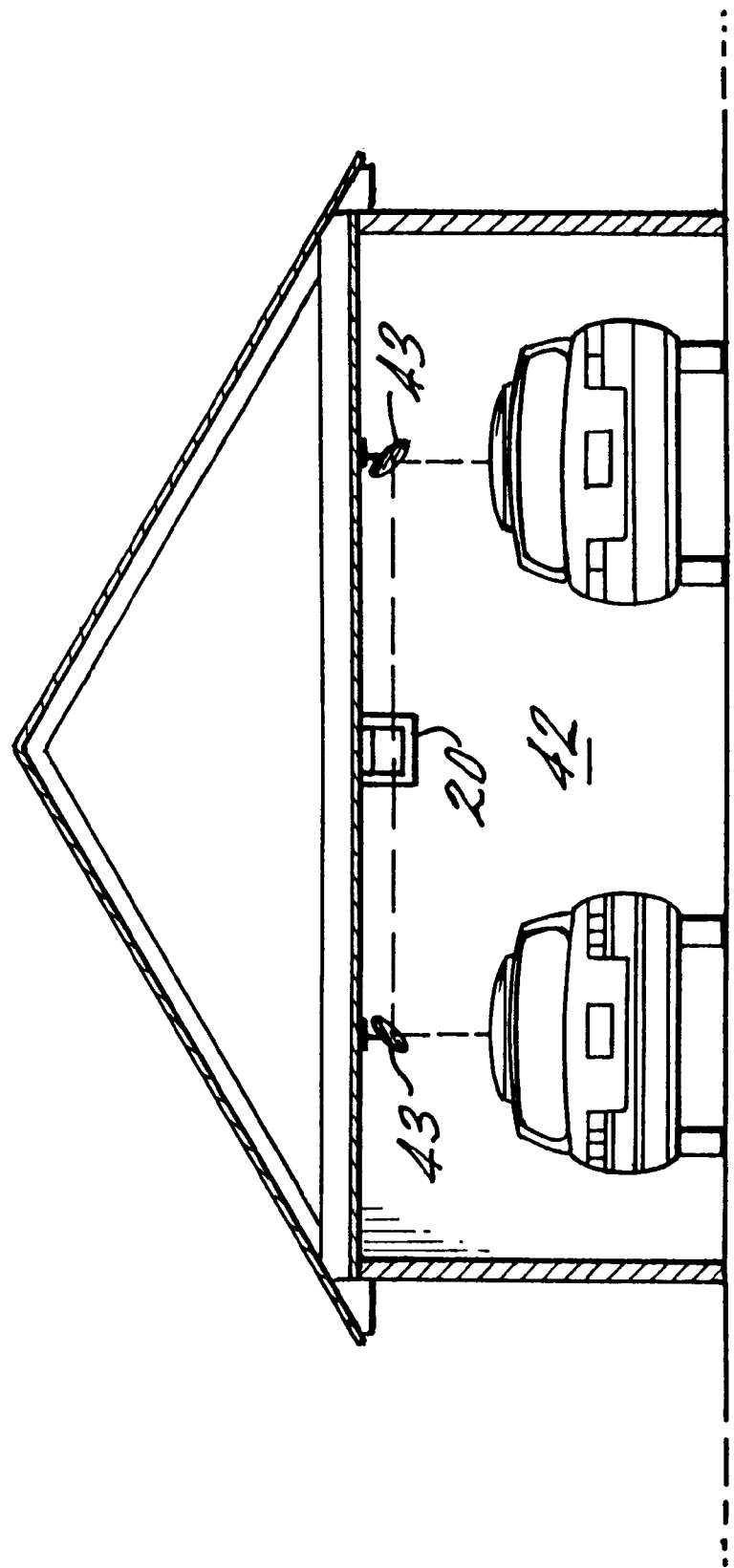
FIG. 10 is a end view of an embodiment of the power transmission unit installed in a garage.

FIGS. 8 and 9 show two of the possible methods for charging the energy storage unit in the vehicle when the vehicle is not in use. Point of purchase power transmission unit 40 includes control 41. The operator of vehicle 9 would would exchange currency in the form of cash or electronic transfer with control unit 41 corresponding to a preselected amount of electrical energy. While parked in proximity to the point of purchase power transmission unit wireless power energy transmission 5 would recharge the energy storage unit in the vehicle. In a similar fashion FIG. 9 shows electric vehicle 9 in garage 42. Shown is power transmission unit 20 installed above the vehicle. Charging of the vehicle would occur while parked in proximity with the power transmitting unit. It is. contemplated that there also may be a power transmission unit mounted outside the garage to charge a vehicle parked in the driveway. FIG. 10 shows a garage 42 where two vehicles may be charged by a single power transmitting unit 20 centrally located in the garage. Reflecting mirrors 43 are mounted above each vehicle's receiving antenna to direct the power beam from the power transmitter to the receiving antennae without need for a translocator signal. In addition the power transmission unit operated as described would not required the sophisticated tracking and locating capability of those described earlier. It is contemplated that the vehicles would be charged sequentially or simultaneously.

Although reference is given specifically to microwave, millimeterwave and laser wireless energy beams, these do not preclude the use of any other type of wireless energy beam that may be developed. The feasibility of electron beams, ion beams and other technologies are also contemplated in a wireless power transmission network utilized in the vehicle remote charge system.

Currently the distance that an all-electric vehicle can travel between charges with, for example, a battery pack as the energy storage unit, is 80–100 miles. This is the range the vehicle could travel if it did not encounter a power transmitting unit to recharge the vehicle's energy storage unit. But as the system grows, and there are more power transmitting units along the road to maintain the vehicle charge, the available range in the storage pack becomes less of an issue. The energy that is stored on-board the vehicle provides adequate reserve to move about freely between charging units. The power transmitting units are constantly topping off the reserve stored energy in the vehicle so that the vehicle can maintain this free movement.

Until power transmitting units expand into rural areas, a hybrid vehicle as described herein above would ease the transition between a typical internal combustion engine vehicle and all-electric vehicle. Electric vehicles would have small gasoline-driven generators that would start automatically to recharge the energy storage unit if a power transmitting unit were not encountered for some distance. If enough power transmitting units passed to charge the energy storage unit, then the gasoline-driven generator is never started or used.

An example of the operation of an embodiment of the present invention is that of a bus. For illustration purposes it is contemplated the bus is an all-electric bu operating in a mass transportation system that has the mobility of a current transportation systems having an internal combustion engine as the mode of power. Consider a 46 passenger, public transportation vehicle, having a mass of 15,000 kg and a 195 kW (277 hp) electric motor. For city traveling, consider power transmitting units to be every 1 km. In certain embodiments for a busy downtown street it is contemplated that there may actually be a power transmission is unit placed every 200 to 300 meters, but for this example 1 km will be used. It is assumed that the bus to be travels at 55 km/h (35 mph) and a power transmitting unit to would have visibility of the bus 150 m prior to the power transmission unit and 150 m after the power transmission unit. That is, the power transmitting unit has visibility of the bus for 300 m and can charge the onboard energy storage unit for 19.64 seconds.

The amount of energy that can be transferred via wireless power transmission approximately 450 kW. The efficiency of such energy transmissions has been estimated to be about 76%. Therefore, for this example, a conservative value of 150 kW will be received and stored in the energy storage unit of the bus. At 55 km/h, the energy storage unit will receive 0.8182 kW-h of the recharge energy as it passes the power transmitting unit. Although the bus has a full power capability of 195 kW, when the vehicle is traveling at 55 km/h, it utilizes about 35 kW. With the power transmitting units every 1 km, the bus will consume 0.6364 kW-h of energy. That is 22.2% less than can be theoretically supplied by the power transmitting unit. Therefore the bus would not have to receive electrical power from the power transmitting unit the entire time between units if the electrical storage unit on the bus were fully charged at this junction of time.

Now consider the bus making a stop for passengers. To accelerate the vehicle from a dead standstill to 55 km/h, consider the bus to use 175 kW. The bus will have to pause about 25 seconds to allow passengers to enter and exit the bus, and all the time the bus is standing still, the power transmitting unit can be charging the electrical energy storage unit. Allow the bus 10 seconds to accelerate up to speed. From the time the bus comes into view of the power transmitting unit, stops for passenger movement, and then leaves the bus stop, 1.4583 kW-h of energy is added to the bus's energy storage unit. To accelerate the bus up to 55 km/h, and travel to the next power transmitting unit, the bus consumes 0.9316 kW-of energy. Again, this is considerably less than was added to the system at the previous stop. Therefore the vehicle energy storage unit would not have to receive energy the entire time at the stop if it had already been close to full charge.

In another example an urban vehicle or private passenger car will be considered. For the urban setting, it can be assumed that power transmitting units are located every 2 km. The urban vehicle will be about 750 kg with a 28 kW (40 hp) electric motor. Traveling at 55 km/h (35 mph) the vehicle will require about 4.9 kW of electric power. Again, with the power transmitting unit's line of sight of the vehicle being 300 m, the energy storage unit will receive 0.8182 kW-h of recharge energy. The vehicle will consume 0.1779 kW-h of energy traveling at 55 km/h with 2 km between the power transmitting units. This is 78.3% less energy used than is theoretically available from the power transmitting unit.

Now consider an urban vehicle traveling at 105 km/h (65 mph) on the highway. The vehicle will require about 17.5 kW of power to travel at this speed. When passing a power transmitting unit, the urban vehicle will receive 0.4286 kW-h of energy added to the electrical energy storage unit. With the power transmitting units 2 km apart, the vehicle will consume 0.3328 kW-h of energy between possible charging to the electrical energy storage unit on-board the vehicle. This is 22.4% less than can be theoretically added via the wireless power transmission network.

The electric public transportation system proposed here will eliminate many of the problems associated with internal combustion driven systems. Buses will be sent out on their routes with convenient in-route charging. There will be minimum route changes to accommodate vehicle recharging. The buses will have full mobility and can avoid any traffic tie-ups caused by tethered or tracked vehicles.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A remote power system, comprising:
   a source of energy;
   a power transmission unit operably connected to said energy source, comprising:
      power unit transmitter means selectively activatable between on and off conditions, said power transmitter means in said on condition transmitting said energy as a directional wireless power beam,
      power unit communication means for receiving a vehicle communication signal,
      power unit controller means operably connected to said power unit communication means and said power transmitter means for activating said power transmitting means between said on and off conditions as a function of said received vehicle communication signal; and
   a first surface vehicle including a power receiver system comprising:
      energy receiving means mounted to said first vehicle for receiving said wireless power beam,
      energy conversion means for transforming said received wireless power beam to a vehicle storable energy form,
      energy storage means for storing said vehicle storable energy form,
      power usage monitoring means for determining the level of energy stored in said storage means,
      translocator means operably connected to said power usage monitoring means for transmitting said vehicle communication signal when said energy level is below a predetermined level and terminating said communication signal when said energy level is at or above said predetermined level.

2. The remote power system of claim 1 wherein said wireless power beam is at least one beam selected from the group consisting of radio frequency beam, laser beam, electron beam, and ion beam.

3. The remote power system of claim 1 wherein said wireless power beam has a frequency within the microwave range.

4. The remote power system of claim 1 wherein said wireless power beam is coherent light.

5. The remote power system of claim 1 wherein said power transmission unit is ground based.

6. The remote power system of claim 1 wherein said power transmission unit comprises vehicle tracking means for locating said first vehicle energy receiving means and directing said wireless power beam thereto.

7. The remote power system of claim 6 further comprising a second surface vehicle wherein said power transmission unit sequentially transmits said power beam to both said first and second vehicle energy receiving means.

8. The remote power system of claim 1 wherein said wireless power beam is pulsed.

9. The remote power system of claim 1 wherein said first vehicle comprises a translocator energy unit having a user determinable number of energy credits and operable to allow power beam transmission from the power transmission unit to the first vehicle until the energy credits are depleted.

10. The remote power system of claim 1 wherein said vehicle communication signal comprises a data stream.

11. The remote power system of claim 1 wherein said vehicle communication signal is encrypted.

12. The remote power system of claim 1 comprising an additional power transmission unit spaced from said power transmission unit, wherein in response to said first vehicle communication signal a power beam is transmitted to said first vehicle initially by one of said power transmission unit and said additional power transmission unit and subsequently by the other of said power transmission unit and said additional power transmission unit.

13. A method for powering a surface vehicle having an antenna and an energy storage device with a variable energy level, comprising:
   monitoring said energy level in said storage device;
   activating a vehicle communication signal when said energy level is below a pre-established level;
   receiving said vehicle communication signal at a first power transmission unit;
   starting transmission of energy as a wireless power beam from said first power transmission unit to said vehicle antenna in response to said vehicle communication signal;
   deactivating said vehicle communication signal when said energy level is at or above said preestablished level; and
   stopping transmission of said power beam in response to said vehicle communication signal deactivation.

14. The method of claim 13 wherein said vehicle communication signal comprises a data stream and comprising the step of locating said vehicle antenna location.

15. The method of claim 13 wherein said power beam is comprised of discrete pulses.

16. The method of claim 13, wherein said vehicle is moving and comprising the step of tracking said vehicle antenna location.

17. The method of claim 16, comprising:
   stopping said power beam transmission from said first power transmission unit as a function of said vehicle movement; and
   starting transmission of a wireless directional power beam from a second power transmission unit to said vehicle antenna in response to said vehicle communication signal and said vehicle movement.

* * * * *